United States Patent [19]

Voorman

[11] Patent Number: 5,105,163

[45] Date of Patent: Apr. 14, 1992

[54] BALANCED FILTER CIRCUIT HAVING A SINGLE AMPLIFIER

[75] Inventor: Johannes O. Voorman, Eindhoven, Netherlands

[73] Assignee: U.S. Philips Corp., New York, N.Y.

[21] Appl. No.: 591,345

[22] Filed: Oct. 1, 1990

[30] Foreign Application Priority Data

Oct. 3, 1989 [NL] Netherlands ............. 8902449

[51] Int. Cl.⁵ .................. H03F 1/36; H03F 1/191
[52] U.S. Cl. ..................... 330/107; 330/306
[58] Field of Search ............. 330/107, 109, 252, 294, 330/302, 303, 304, 305, 306

[56] References Cited

U.S. PATENT DOCUMENTS

4,509,019 4/1985 Banu et al. .................. 330/107
4,697,152 9/1987 Westwick .................. 330/9
4,926,135 5/1990 Voorman .................. 330/107

Primary Examiner—Steven Mottola
Attorney, Agent, or Firm—Steven R. Biren

[57] ABSTRACT

A balanced filter circuit includes only one balanced amplifier (10) having an inverting input (6) and a non-inverting input (5) and an inverting output (7) and a non-inverting output (8) for realization of filter transfer functions Uout/Uin of the second or higher order from an input signal Uin at input terminals (1, 2) to an output signal Uout at output terminals (3, 4) having passive admittances which are composed of a parallel-combination of a resistor (R42, R44) and/or a capacitor (C41, C44) and/or a number of series-combinations of a resistor (R41, R43, R45) and a capacitor (C42, C43, C45).

7 Claims, 5 Drawing Sheets

BALANCED FILTER CIRCUIT HAVING A SINGLE AMPLIFIER

BACKGROUND OF THE INVENTION

The invention generally relates to balanced filter circuits. Such circuits are known from U.S. Pat. No. 4,509,019 and are composed of a number of balanced amplifiers having inverting and non-inverting inputs and outputs, which are coupled to each other via resistors and/or capacitors. The manner in which this coupling is effected and the values of the resistors and capacitors are determinative of the shape and the order of the transfer function from the inputs to the outputs of the filter circuit. In the known balanced filter circuits, the number of balanced amplifiers increases with the order of the transfer function of the filter circuit. For filter circuits of higher order the complexity of the circuit consequently rapidly increases.

SUMMARY OF THE INVENTION

The invention has for its object to provide a balanced filter circuit having a composition which is simple even with a higher order of the transfer function.

According to the invention, this object is achieved by a balanced filter circuit having an Nth order transfer function $H_N$ from a balanced input signal to a balanced output signal, N being an integer larger than or equal to two, comprising:
- a first and a second filter input for supplying the balanced input signal;
- a first and a second filter output for deriving the balanced output signal;
- only one balanced amplifier having an inverting and a non-inverting input and an inverting output coupled to the first filter output and a non-inverting output coupled to the second filter output;
- at least one of a first, a second, a third and a fourth pair of admittances with each pair having a first and a second admittance, the first admittance of the first pair of admittances being connected between the first filter input and the inverting input and the second admittance being connected between the second filter input and the non-inverting input, the first admittance of the second pair of admittances being connected between the first filter input and the non-inverting input and the second admittance being connected between the second filter input and the inverting input, the first admittance of the third pair of admittances being connected between the inverting output and the non-inverting input and the second admittance being connected between the non-inverting output and the inverting input and the first admittance of the fourth pair of admittances being connected between the inverting output and the inverting input and the second admittance being connected between the non-inverting output and the non-inverting input.

According to the invention, a desired balanced filter circuit of the second order or of a higher order can be realized with only one amplifier. As a result, from the order two on up, a very simple filter configuration is obtained. Due to the fact that this configuration comprises only one amplifier, the filter circuits according to the invention require only a limited number of electronic components, which permits integration on a comparatively small surface.

The invention is based on the recognition of the fact that the transfer from the input signal Uin to the output signal Uout of each linear filter circuit can be written as:

$$\frac{U_{\text{out}}}{U_{\text{in}}} = \frac{Y_1(P) - Y_2(P)}{Y_3(P) - Y_4(P)}$$

with P representing the complex frequency and Y1(P), Y2(P), Y3(P) and Y4(P) being the complex admittances of a first and a second positive admittance of four pairs of admittances. Further, each of the four admittances Yi(P) can be described as a series of the type:

$$Y_i(P) = a + b*P + \text{SUM}_K(P*A_K/(P+B_K))$$

in which a, b, $A_K$ and $B_K$ are real non-negative numbers. The term a represents the admittance of a resistor having a value 1/a, while the term b*P represents the admittance of a capacitor having a value b and each of the terms of the sum SUM represent the admittance of a series-combination of a resistor having a value $1/A_K$ and a capacitor having a value $A_K/B_K$. The admittances Yi can be realized with resistors and capacitors and when connected to the inputs and outputs of one balanced amplifier they yield a transfer function of the aforementioned type. Negative coefficients in the transfer function are discounted in the admittances Y2 and Y4, which are connected in cross-coupled fashion with respect to the admittances Y1 and Y3 to the inputs of the amplifier.

A first embodiment of a balanced filter circuit according to the invention is characterized in that the filter circuit has a second order transfer function having the shape:

$$H_2 = \frac{M * P * W_o/Q_o}{P*P + P*W_o/Q_o + W_o*W_o}$$

in which
- P = complex frequency,
- Wo = resonance frequency,
- Qo = Q factor and $Q_o > \frac{1}{2}$,
- M = amplification factor, and
- the first and the second admittance of the second pair of admittances each comprise a series-combination of a first resistor having a value substantially equal to K*Qo/Wo/M and a first capacitor having a value substantially equal to M*Wo/(Qo*a*K);
- the first and the second admittance of the third pair of admittances each comprise a parallel-combination of a second resistor having a value substantially equal to K*a/(Wo*Wo) and a capacitor having a value substantially equal to 1/K;
- the first and the second admittance of the fourth pair of admittances each comprise a series-combination of a third resistor having a value substantially equal to −K/(−a+Wo/Qo−Wo*Wo) and a third capacitor having a value substantially equal to −(−a+Wo/Qo−Wo*Wo)/(a*K), a and K being positive real numbers. This filter circuit is a resonance circuit, which is particularly suitable for use in selective amplifiers.

With the choice of a = Wo, a second embodiment of a balanced filter circuit according to the invention is obtained, which is characterized in that
- the first and the second admittance of the second pair of admittances each comprise the series-combination of a first resistor having a value substantially equal to Qo*R/M and a first capacitor having a value substantially equal to M*C/Qo;

the first and the second admittance of the third pair of admittances each comprise the parallel-combination of a second resistor having a value substantially equal to R, a second capacitor having a value substantially equal to C and a series-combination of a third resistor having a value substantially equal to Qo*R and a third capacitor having a value substantially equal to C/Qo;

the first and the second admittance of the fourth pair of admittances each comprise a series-combination of a fourth resistor having a value substantially equal to R/2 and a fourth capacitor having a value substantially equal to 2*C, R and C being constants to be chosen, for which it holds that: R*C=1/Wo. In this second embodiment, the filter parameters resonance frequency $W_o$ and Q factor $Q_o$ are directly present in the element values, which is of importance if one of these parameters should be regulated. The embodiment is moreover particularly suitable for low values of $Q_o$, at which the spread of the element values, i.e. the ratio between the largest and the smallest value, is not excessively large.

A third embodiment of a balanced filter circuit according to the invention is characterized in that the filter circuit has a second order transfer function having the shape:

$$H2 = \frac{P*P - P*Wo/Qo + Wo*Wo}{P*P + P*Wo/Qo + Wo*Wo} * M$$

in which
P=complex frequency,
Wo=resonance frequency,
Qo=Q factor of Qo≧½,
M=amplification factor,
and the first and the second admittance of the first pair of admittances each comprise a parallel-combination of a first resistor having a value substantially equal to R/M and a first capacitor having a value substantially equal to M*C;

the first and the second admittance of the second pair of admittances each comprise a parallel-combination of a series-combination of a second resistor having a value substantially equal to R/(2*M) and a second capacitor having a value substantially equal to 2*M*C and a series-combination of a third resistor having a value substantially equal to Qo*R/M and a third capacitor having a value substantially equal to M*C/Qo;

the first and the second admittance of the third pair of admittances each comprise a parallel-combination of a fourth resistor having a value substantially equal to R, a fourth capacitor having a value substantially equal to C and a series-combination of a fifth resistor having a value substantially equal to R/2 and a fifth capacitor having a value substantially equal to 2*C;

the first and the second admittance of the fourth pair of admittances each comprise a series-combination of a sixth resistor having a value substantially equal to Qo*R and a sixth capacitor having a value substantially equal to C/Qo, R and C being constants to be chosen, for which it holds that R*=1/Wo. This filter circuit is an all-pass network and due to its simplicity it is particularly suitable for group delay correction of filters which otherwise could be corrected only by means of comparatively complicated circuits.

A fourth embodiment of a balanced filter circuit according to the invention is characterized in that the filter circuit has a third order transfer function having the shape:

$$H3 = \frac{(P*P - a*P + b)(P - c)}{(P*P + a*P + b)(P + c)} * M$$

in which
P=complex frequency,
a, b, c=a real positive number larger than zero and a*a<4*b
M=amplification factor
and the first and the second admittance of the first pair of admittances each comprise a parallel-combination of a first capacitor having a value substantially equal to M/K and the series-combination of a first resistor having a value substantially equal to K/A/M and a second capacitor having a value substantially equal to M*A/(c*K)

the first and the second admittance of the second pair of admittances each comprise a parallel-combination of a second resistor having a value substantially equal to K/M*b/d and a series-combination of a third resistor having a value substantially equal to −K/B/M and a third capacitor having a value substantially equal to −B*M/(d*K);

the first and the second admittance of the third pair of admittances each comprise a parallel-combination of a fourth resistor having a value substantially equal to K*b/d and a capacitor having a value substantially equal to 1/K;

the first and the second admittance of the fourth pair of admittances each comprise a series-combination of a fifth resistor having a value substantially equal to −K/C and a fifth capacitor having a value substantially equal to −C/(d*K), in which
d is a positive real number larger than c,
A=2*(c*c+a*c+b)/(d−c)
B=−(d+a+b/d)(d+c)/d−c)
C=−(d−a+b/d)
and
K is a positive real number.

This filter circuit is an all-pass network which is particularly suitable for use as a section of a delay line having taps, the low Q factor of the complex pole pair being advantageous with the implementation with one amplifier.

BRIEF DESCRIPTION OF THE DRAWING

The invention will be described more fully with reference to the accompanying drawing, in which.

DESCRIPTION OF THE PREFERRED EMBODIMENTS

Figure 1:
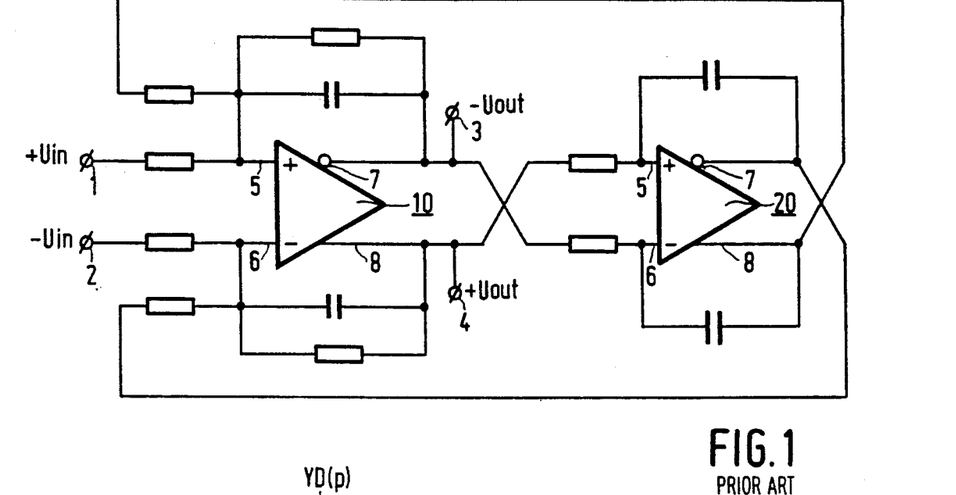
FIG. 1 shows a known balanced band-pass filter circuit of the second order.

FIG. 1 shows a known balanced filter circuit. The circuit comprises two balanced amplifiers 10, 20 each having a non-inverting input 5, an inverting input 6, an inverting output 7 and a non-inverting output 8. The inputs 5, 6 are connected via resistors and/or capacitors to filter inputs 1, 2 of the filter circuit and/or to the outputs of the same amplifier and/or the outputs of one or more other amplifiers. The outputs 7, 8 of one of the amplifiers, in this case those of the amplifier 10, are connected to the filter outputs 3, 4. The signal Uin to be filtered is supplied in balanced form as $+\text{Uin}/-\text{Uin}$ at the filter inputs 1, 2. The filtered signal is available in balanced form as $-\text{Uout}/+\text{Uout}$ at the filter outputs 3, 4. The configuration of the circuit determines the transfer function Uout/Uin of the filter. This transfer function can be written as the ratio between a numerator polynomial N(P) and a denominator polynomial D(P) of the complex frequency P with real coefficients:

$$\frac{U_{out}}{U_{in}} = \frac{N(P)}{D(P)} \quad (1)$$

The highest of the degrees of numerator and denominator polynomials determines the order of the transfer function. The filter circuit of FIG. 1 has a transfer function of the order 2 and behaves like a second order band-pass filter. In the known filter circuit, the number of balanced amplifiers is equal to the order of the transfer function of the filter. This generally holds for balanced filter circuits known hitherto, not only for the second order filter circuit of FIG. 1. From the order 2 the filter design can be simplified with a balanced filter circuit according to the invention because by means of this circuit any filter type of any order can be realized with only one balanced amplifier. The single amplifier on the one hand permits a small supply current consumption of the filter circuit. On the other hand, the supply current available, which in the known filter circuits must be distributed over several amplifiers, can now be fully utilized for the single amplifier. This single amplifier can thus be optimized, for example, with regard to bandwidth, modulation range or load capacity. The filter circuit according to the invention further has the advantage that no voltage build-up occurs within the filter configuration, as a result of which comparatively large signals can still be processed without being distorted. In fact, in contrast with the known filter circuits of higher order, there are now no amplifier outputs, such as, for example, those of the amplifier 20 in the circuit of FIG. 1, which can convey uncontrolled high signal voltages due to resonance.

The transfer function of a filter can be written as:

$$\frac{U_{out}}{U_{in}} = \frac{N(P)}{D(P)} = \quad (2)$$

$$\frac{N'(P) * \text{PRODUCT}_K(P + Z_K) * \text{PRODUCT}_K(P + C_K)}{D'(P) * \text{PRODUCT}_K(P + P_K) * \text{PRODUCT}_K(P + C_K)}$$

There are separated out of N(P) nNr separate negative real zero points and out of D(P) nDr separate negative real zero points. If the degrees of the polynomials N(P) and D(P) are set to nN and nD, respectively, the degree of N'(P) is equal to nN−nNr and that of D'(P) is equal to nD−nDr. A number nc of the negative real zero points in N(P) and D(P) are additional common factors P+C$_K$. The equation (2) can be rewritten as:

$$\frac{N(P)}{D(P)} = \frac{N'(P)}{\text{PRODUCT}_K(P + P_K) * \text{PRODUCT}_K(P + C_K)} / \quad (3)$$

$$\frac{D'(P)}{\text{PRODUCT}_K(P + Z_K) * \text{PRODUCT}_K(P + C_K)} =$$

$$YN(P)/YD(P)$$

Figure 2A:
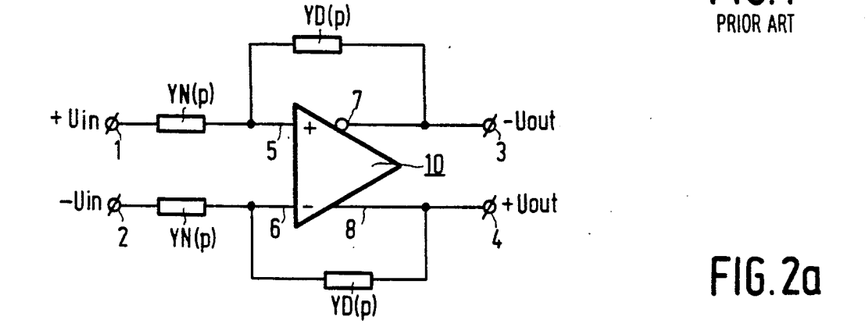
FIGS. 2a, 2b, 2c and 2d show circuit diagrams for the explanation of the operation of balanced filter circuits according to the invention.

The terms YN(P) and YD(P) are each a quotient of polynomials in P. When it is ensured that all poles of YN(P) and of YD(P) are different and lie on the negative real axis, YN(P) and YD(P) can be constructed as admittances, which are connected in the manner shown in FIG. 2a. In this Figure, a balanced filter circuit is shown having filter inputs 1, 2, which are connected via an admittance YN(P) to the non-inverting input 5 and the inverting input 6 of a balanced amplifier 10, whose inverting output 7 and whose non-inverting output 8 are connected via an admittance YD(P) to the non-inverting input 5 and the inverting input 6, respectively, and further directly to the filter outputs 3 and 4, respectively. For the circuit of FIG. 2a the relation (3) holds.

For the degrees of the numerator and the denominator of the admittances YN(P) and YD(P) it holds that:
Numerator YN(P): nN−nNr
denominator YN(P): nDr+nc (5)
numerator YD(P): nD−nDr
denominator YD(P): nNr+nc.

The actions:
1) release of a factor P+Z$_K$ from N(P)
2) release of a factor P+P$_K$ from D(P) and
3) take-up of a common factor P+C$_K$, result in that the degree of the numerator minus the degree of the denominator of YN(P) and of YD(P) decreases per action by one. The actions 1), 2) and 3) are repeated until the degree of the numerator minus the degree of the denominator of YN(P) and of YD(P) has fallen to one or lower, in general a minimum number of common factors P+C$_K$ being taken up in order that the complexity of the resulting filter circuit is not unnecessarily enlarged.

The result is a transfer function N(P)/D(P)=YN(P)/YD(P), in which for YN(P) and YD(P) it holds that:
they are quotients of polynomes with real coefficients,
all poles are different and are located on the negative real axis
and
the degree of the numerator is at most 1 higher than the degree of the denominator.

Figure 2B:
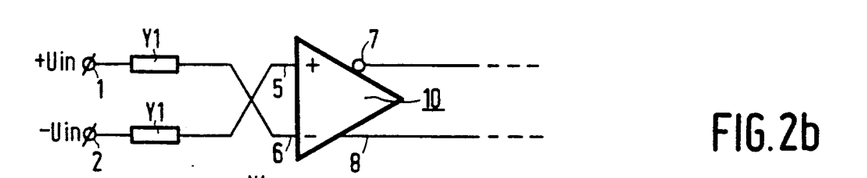
Figure 2C:
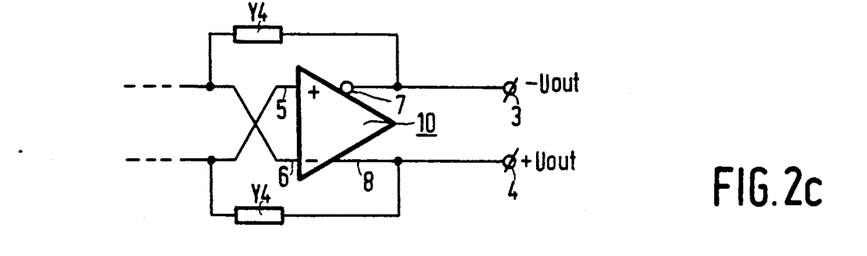
Figure 2D:
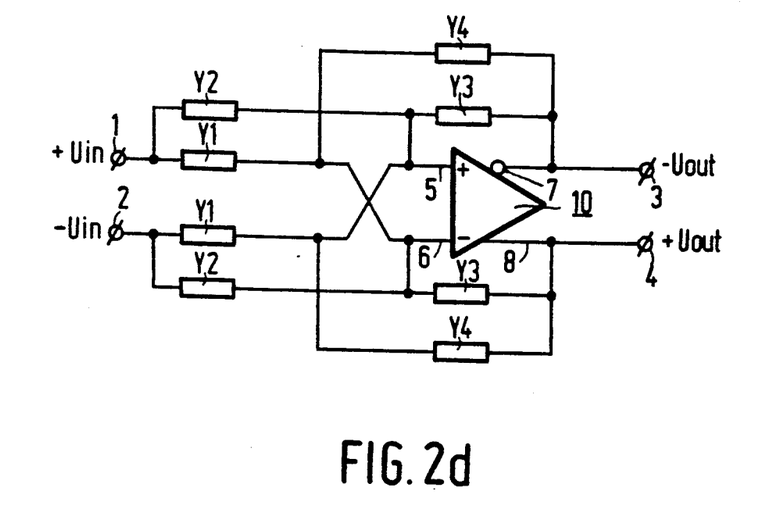

YN(P) and YD(P) can now be written by breaking into partial fractions as:

$$YN(P), YD(P) = a + b*P + SUM_K(P*A_K/P + B_K) \quad (6)$$

in which a, b, $A_K$ and $B_K$ are real and $B_K$ is positive. The term a is the conduction of a resistor having a value 1/a. The term b*P is the admittance of a capacitor having a value b. The term $P*A_K/(P+B_K)$ is the admittance of a series-combination of a resistor having a value $1/A_K$ and a capacitor having a value $A_K/B_K$. Negative values of a, b and $A_K$ are discounted by cross-coupling of the relevant admittances, as shown in FIGS. 2b and 2c. In these Figures, corresponding parts have the same reference numerals as in FIG. 2a. FIG. 2b indicates how a pair of admittances Y1 is cross-coupled between the filter inputs 1, 2 and the inputs 5, 6 of the amplifier 10. One admittance of the pair of admittances is connected between the filter input 1 and the inverting input 6 and the other admittance is connected between the filter input 2 and the non-inverting input 5. In FIG. 2c, one admittance of the pair of admittances Y4 is connected between the inverting output 7 and the inverting input 6 and the other admittance is connected between the non-inverting output 8 and the non-inverting input 5. FIG. 2d shows a balanced amplifier, which is provided not only with cross-couplings with pairs of admittances Y1 and Y4, as indicated in FIGS. 2b and 2c, but is also provided in the manner indicated for YN(P) and YD(P) in FIG. 2a with pairs of admittances Y2 and Y3, respectively. For the transfer function of the circuit of FIG. 2d there can now be written:

$$\frac{U_{out}}{U_{in}} = \frac{YN(P)}{YD(P)} = \frac{Y1(P) - Y2(P)}{Y3(P) - Y4(P)} \quad (7)$$

Positive terms in the equation (6) together form the admittances Y1(P) or Y3(P), while negative terms are united in the admittances Y2(P) or Y4(P).

With reference to a few examples, the design of $N^{th}$ order filter circuits ($N \geq 2$) comprising one balanced amplifier will now be described. In these examples, the transfer functions $H_N$ can be multiplied by the amplification factor M in order that a given amplification or attenuation from the input signal to the output signal of the filter circuit is obtained. This factor M can be simply attained in that either the admittances Y1 and Y2 or the admittances Y3 and Y4 are multiplied by a factor M. This means that of the relevant admittance the values of resistors must be divided by M and the values of capacitors must be multiplied by M.

EXAMPLE 1

Second Order Resonance Circuit

The transfer function thereof is:

$$\frac{U_{out}}{U_{in}} = \frac{YN(P)}{YD(P)} = \frac{P*Wo/Qo}{P*P + P*Wo/Qo + Wo*Wo} \quad (8)$$

Therein, Wo is the resonance frequency and Qo is the Q factor, for which it is assumed that $Qo > \frac{1}{2}$. The poles are additively complex. For YN(P) and YD(P), the common factor (p+a) is introduced:

$$YN(P) = \frac{Wo}{Qo} * \frac{P}{P + a} \quad (9A)$$

-continued $$YD(P) = \frac{P*P + P*Wo/Qo + Wo*Wo}{P + a} = \quad (9B)$$

$$= AA + BB*P + A*P/(P + a) \quad (9C)$$

in which:
AA = Wo*Wo/a
BB = 1
A = −a + Wo/Qo − Wo*Wo/a < 0
The coefficient A is negative, for in:

$$A = -Wo\left(\frac{a}{Wo} + \frac{Wo}{a} - \frac{1}{Qo}\right)$$

is $$\frac{a}{Wo} + \frac{Wo}{a} \geq 2, \text{ while } \frac{1}{Qo} < 2$$

YN(P) is a positive admittance of an RC series-combination in the position of Y2 in the circuit of FIG. 2d. YD(P) consists of the positive admittances AA and BB*P, which must be arranged in the position Y4. In this example, there is no admittance Y1, i.e. Y1(P)=0. The result is shown in the filter circuit of FIG. 3, in which corresponding parts have the same reference numerals as in FIG. 2. The admittances of the second pair of admittances Y2 are constituted by a series-combination of a resistor R1 and a capacitor C1, those of the third pair of admittances Y3 by a parallel-combination of a resistor R2 and a capacitor C2 and those of the fourth pair of admittances by a series-combination of a resistor R3 and a capacitor C3, where:
R1 = Qo/Wo
C1 = Wo/(Qo*a)
R2 = a/(Wo*Wo)
C2 = 1
R3 = −1/A
C3 = −A/a All resistor values may be multiplied by a given scale factor if at the same time all capacitor values are divided by the same scale factor. The quotient YN(P)/YD(P) consequently does not change in the transfer function Uout/Uin of the filter circuit.

The value of a can be freely chosen. The choice a=Wo now yields substitution in the equation (9A) and (9C):

$$YN(P) = \frac{Wo}{Qo} * \frac{P}{P + Wo} \quad (10A)$$

$$YD(P) = Wo + P + \left(\frac{Wo}{Qo} - 2Wo\right) * \frac{P}{P + Wo} \quad (10B)$$

The third term of YD(P) in the equation (10B) can be seen as the sum of a positive admittance and of a negative admittance, each consisting of a series-combination of a resistor and a capacitor.

Figure 3:
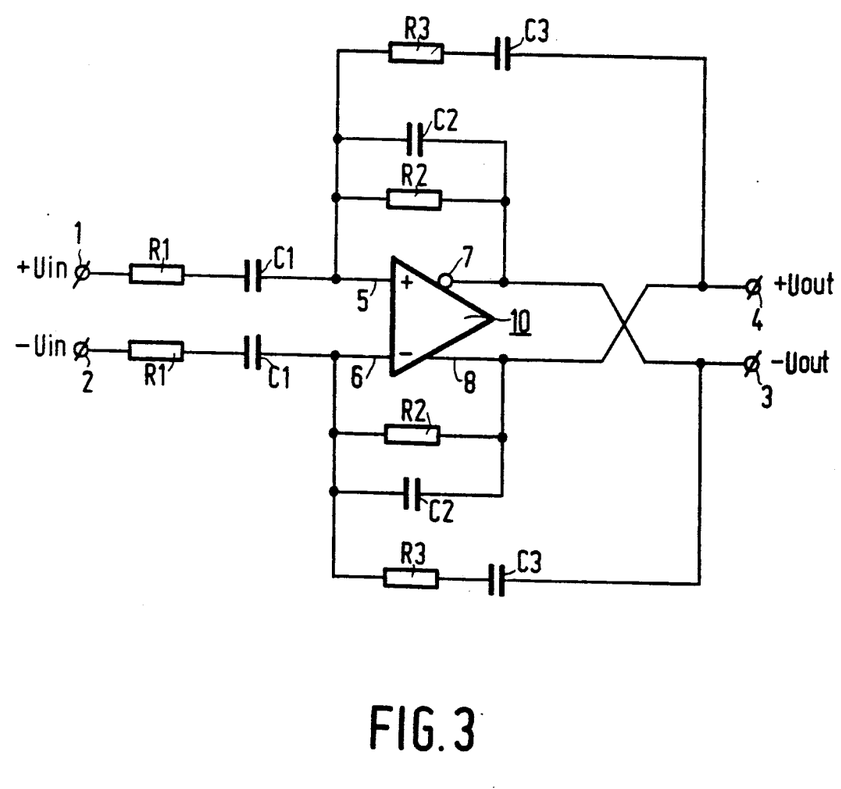
FIG. 3 shows a first embodiment of a second order balanced band-pass filter circuit according to the invention.
Figure 4:
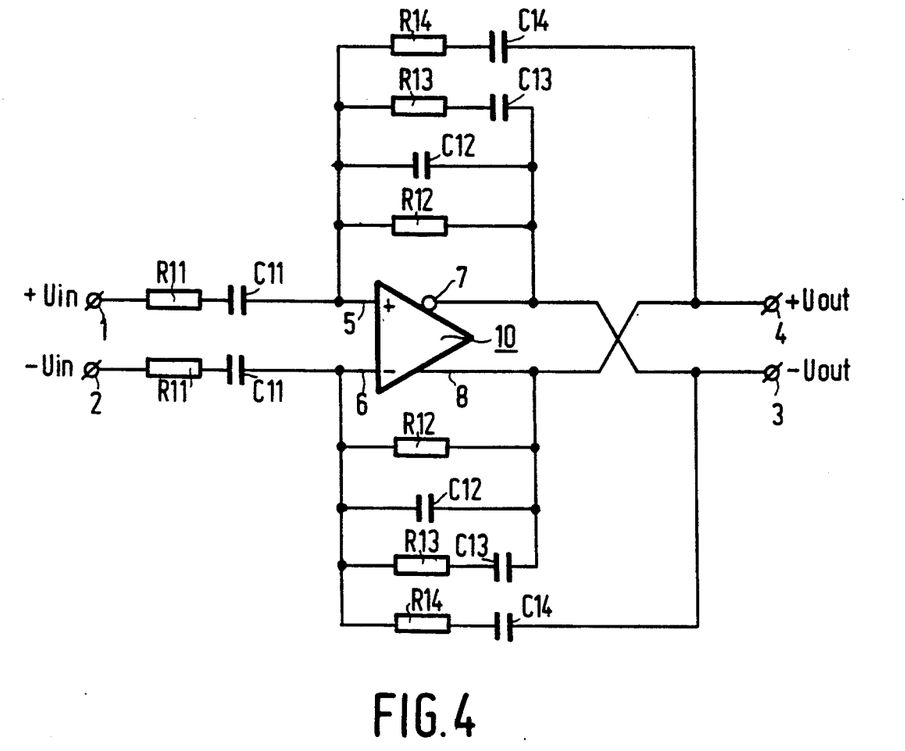
FIG. 4 shows a second embodiment of a second order balanced band-pass filter circuit according to the invention.

In FIG. 4, in which corresponding parts have the same reference numerals as in FIG. 3, the resulting filter circuit is shown. The admittances Y2, Y3 and Y4 of FIG. 2d now correspond to the series-combination of a resistor R11 and a capacitor C11, to a parallel-combination of a resistor R12, a capacitor C12 and a series-combination of a resistor R13 and a capacitor C13 and to a series-combination of a resistor R14 and a capacitor C14, respectively. After multiplication of all resistor values by Wo*R and with the assumption that $C=1/(Wo*R)$ it follows for the values of the resistors and capacitors of the filter circuit of FIG. 4 that:

R11 = R13 = Qo*R
C11 = C13 = C/Qo
R12 = R
C12 = C
R14 = R/2
C14 = 2*C
R*C = 1/Wo

This filter circuit is suitable for resonance circuits having a moderate Qo.

EXAMPLE 2

Second Order All-Pass Filter

In a first version, the poles are unequal and lie on the negative real axis. The transfer function can then be written as:

$$\frac{U_{out}}{U_{in}} = \frac{YN(P)}{YD(P)} = \frac{(P-a)(P-b)}{(P+a)(P+b)} \quad (11)$$

in which $a > b$.

On behalf of fraction splitting of YN(P) and YD(P), in this case no additional common factors are required. This otherwise also holds always for all-pass transfer functions with real poles of any order.

When choosing for $$YN(P) = \frac{(P-a)(P-b)}{(P+a)(P+b)}$$

and for $YD(P) = 1$, after fraction splitting there is obtained:

$$YN(P) = 1 + A*P/(P+a) + B*P/(P+b) \quad (12A)$$

$$YD(P) = 1 \quad (12B)$$

in which
A = 2*(a+b)/(a−b) > 0 and
B = −2*(a+b)/(a−b) < 0

Figure 5:
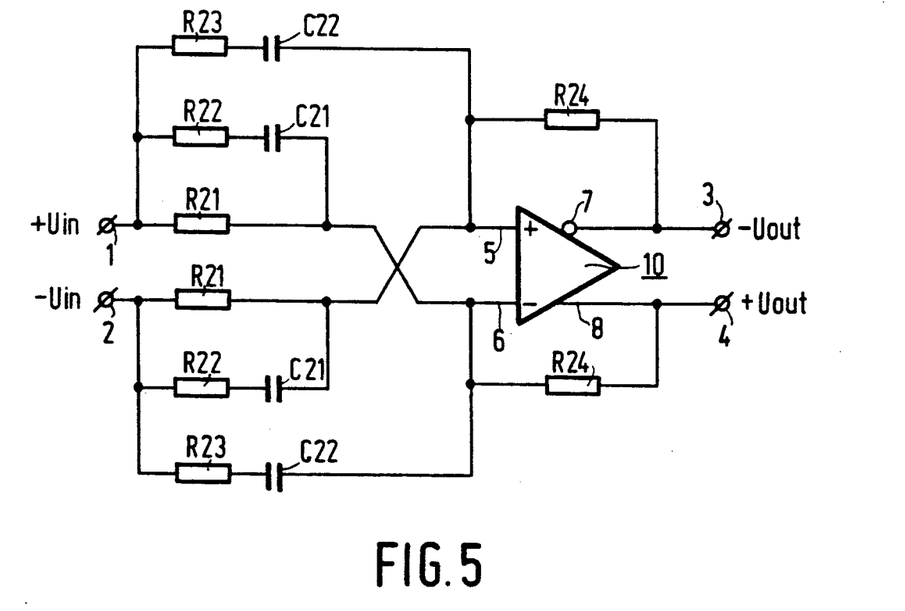
FIG. 5 shows an embodiment of a second order all-pass balanced filter circuit according to the invention.

YN(P) consists of the sum of a positive admittance and a negative admittance so that the admittances Y1 and Y2 in the circuit of FIG. 2d now both have a value unequal to zero. YD(P) consists only of a positive admittance so that the admittance Y4 is now absent in the circuit and only the admittance Y3 is present. FIG. 5 shows the resulting filter circuit. Corresponding parts have the same reference numerals as in FIG. 4. The admittance Y1 is now a parallel-combination of a resistor R21 and a series-combination of a resistor R22 and a capacitor C21. The admittance Y2 is a series-combination of a resistor R23 and a capacitor C22 and the admittance Y3 consists of a resistor R24. It follows from (12A) and (22B) that:

R21 = R24 = 1
R22 = R23 = 1/A
C21 = C22 = A/a.

Also in this case, the resistor values and capacitor values may be scaled as indicated in Example 1.

In a second version of a second order all-pass filter, the poles are complex:

$$\frac{U_{out}}{U_{in}} = \frac{P*P - P*Wo/Qo + Wo*Wo}{P*P + P*Wo/Qo + Wo*Wo} \quad \frac{YN(P)}{YD(P)} \quad (13)$$

in which $Qo \geq \frac{1}{2}$.

For YN(P) and YD(P), a common factor (P+c) is introduced. Partial fraction splitting then yields:

$$YN(P) = (P*P - P*Wo/Qo + Wo*Wo)/(P+c)$$
$$= Wo*Wo/c + P + A*P/(P+c) \quad (14A)$$

$$YD(P) = (P*P + P*Wo/Qo + Wo*Wo)/(P+c)$$
$$= Wo*Wo/c + P + B*P/(P+c) \quad (14B)$$

in which:
A = −c − Wo/Qo − Wo*Wo/c < 0
B = −c + Wo/Qo − Wo*Wo/c < 0

Figure 6:
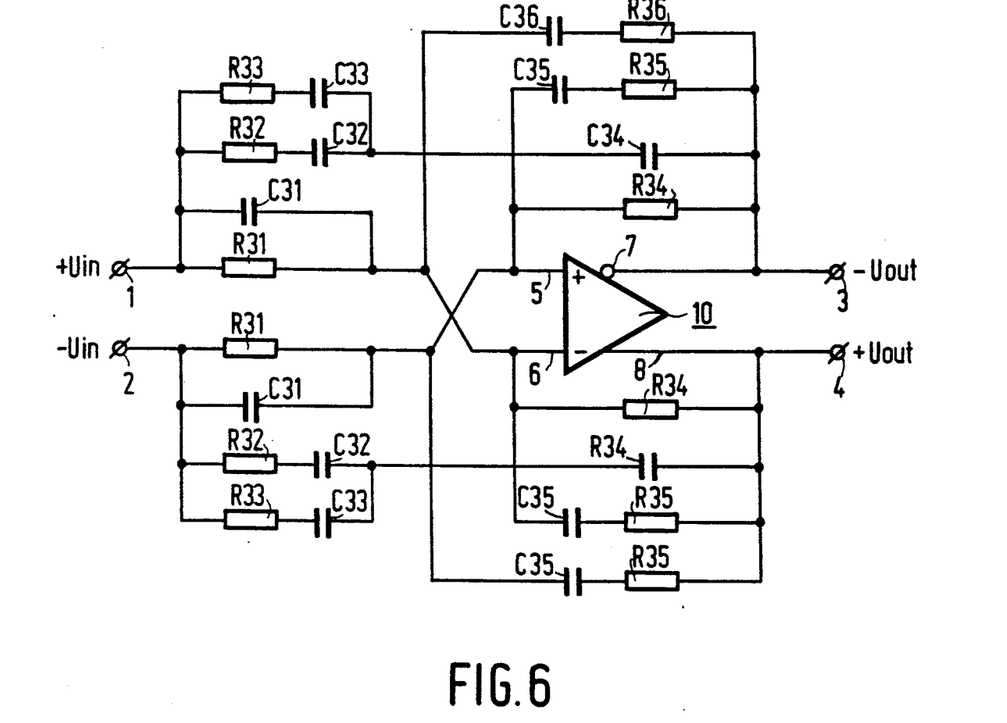
FIG. 6 shows a second embodiment of a second order all-pass balanced filter circuit according to the invention.

The factors A and B are both negative. c can still be chosen freely. For c = Wo and with R*C = 1/Wo, the circuit of FIG. 6 is obtained, in which corresponding parts have the same reference numerals as in FIG. 5. Both YN(P) and YD(P) now comprise positive and negative admittances so that all admittances Y1, Y2, Y3 and Y4 of the circuit of FIG. 2d have a value unequal to zero. The admittance Y1 is a parallel-combination of a resistor R31 and a capacitor C31. The admittance Y2 is a parallel-combination of a first series-combination of a resistor R32 and a capacitor C32, and a second series-combination of a resistor R33 and a capacitor C33. The admittance Y3 is composed of a parallel-combination of a resistor R34, a capacitor C34 and the series-combination of a resistor R35 and a capacitor C35. The admittance Y4 is a series-combination of a resistor R36 and a capacitor C36. For the values of the resistors and capacitors it holds that:

R31 = R34 = R
C31 = C34 = C
R32 = R35 = R/2
C32 = C35 = 2*C
R33 = R36 = Qo*R
C33 = C36 = C/Qo
R*C = 1/Wo

If further Qo is chosen to be equal to $\frac{1}{2}$ (equal real poles in the transfer function), the resistors R32 and R33 and the capacitors C32 and C33 are equal to each other. The admittance Y2 can then be replaced by one series-combination of a resistor and a capacitor.

EXAMPLE 3

Third Order All-Pass Filter.

The transfer function is:

$$\frac{U_{out}}{U_{in}} = \frac{YN(P)}{YD(P)} = \frac{(P*P - a*P + b)*(P-c)}{(P*P + a*P + b)*(P+c)} \quad (15)$$

with a, b, c > 0.

It is assumed that the transfer function has a complex pole pair so that: $a*a < 4*b$. On behalf of partial fraction splitting, the numerator and the denominator of the righthand term in the equation (15) are divided by (P+c). Further, the common factor (P+d) is introduced, where d > 0, and d is unequal to c. As a result, YN(P) and YD(P) can be written as:

$$YN(P) = \frac{(P*P - a*P + b)*(P-c)}{(P+c)*(P+d)} \quad (16A)$$
$$= -b/d + P + A*P/(P+c) + B*P/(P+d)$$

$$YD(P) = \frac{P*P + a*P + b}{P + d} = b/d + P + C*P/(P + d) \quad (16B)$$

in which
A = 2*(c*c+a*c+b)/(d−c)
B = −(d+a+b/d)*(d+c)/(d−c)
C = −(d−a+b/d)

Figure 7:
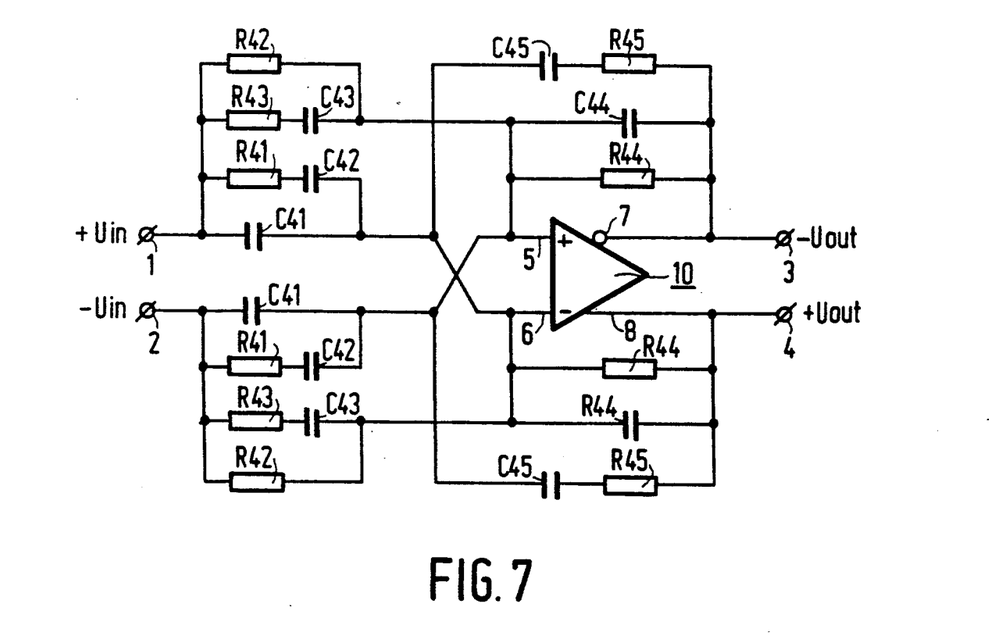
FIG. 7 shows an embodiment of a third order all-pass balanced filter circuit according to the invention.

Since a*a<4*b, C<0. If now d is chosen to be larger than c, A>0 and B<0. The sign of the component admittances is determined thereby and the implementation thereof is indicated in the filter circuit of FIG. 7, in which corresponding parts have the same reference numerals as in FIG. 6. The admittances Y1, Y2, Y3 and Y4 of FIG. 2d are composed as follows: Y1 is a parallel-combination of a capacitor C41 and a series-combination of a resistor R41 and a capacitor C42; Y2 is a parallel-combination of a resistor R42 and a series-combination of a resistor R43 and a capacitor C43; Y3 is a parallel-combination of a resistor R44 and a capacitor C44; Y4 is a series-combination of a resistor R45 and a capacitor C45. For the values of the resistors and capacitors, it holds that:

C41 = 1
R41 = 1/A
C42 = A/c
R42 = b/d
R43 = −1/B
C43 = −B/d
R44 = b/d
C44 = 1
R45 = −1/C
C45 = −C/d

The values of the resistors and capacitors in this case may also be scaled again as indicated in Example 1. The filter circuit of FIG. 7 may be used, for example, as a delay section having a bandwidth b Hz and a delay d seconds, in which b*d = ½. The delay d = 1/(2*b) is then equal to the time interval between two samples of a signal sampled according to Nyquist with 2b Hz and having a bandwidth b.

Figure 8A:
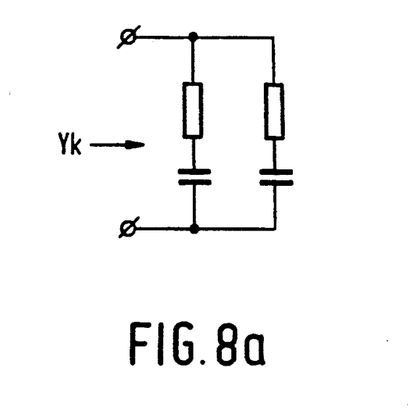
FIGS. 8a, 8b, 8c and 8d show examples of equivalent admittances for use in a balanced filter circuit according to the invention.
Figure 8B:
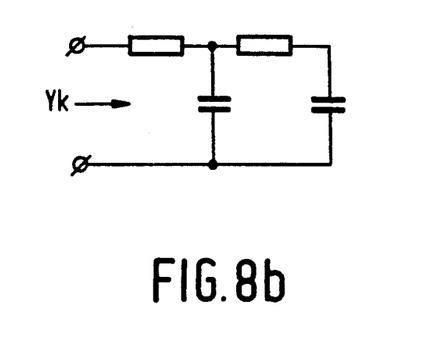
Figure 8C:
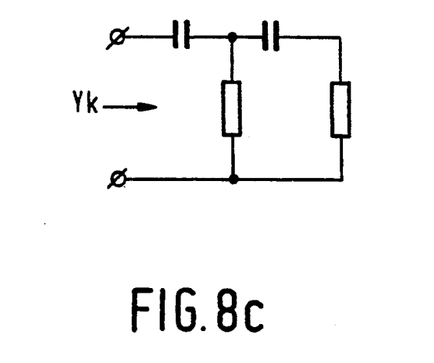
Figure 8D:
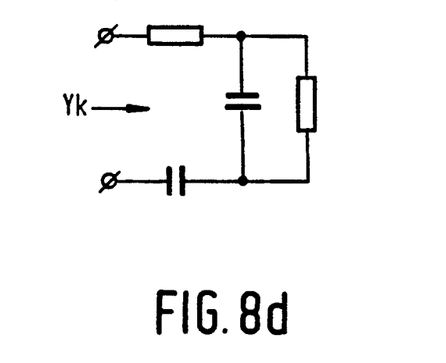

As appears from the Figures, the admittances Y1, Y2, Y3 and/or Y4 may be of fairly complicated nature. With increasing order of the filter circuit it may be advantageous to replace one or more of the admittances Y1, Y2, Y3, Y4 by an equivalent RC ladder type network having an admittance $Y_K$ (K=1, 2, 3 or 4), as indicated in FIG. 8. The circuits shown in FIGS. 8a, 8b, 8c and 8d can all represent with suitably chosen element values the same admittance $Y_K$. The construction of FIG. 8a is known as the Foster type, that of FIGS. 8b and 8c as the Cauer or ladder type, while FIG. 8d shows a mixed form.

Figure 9:
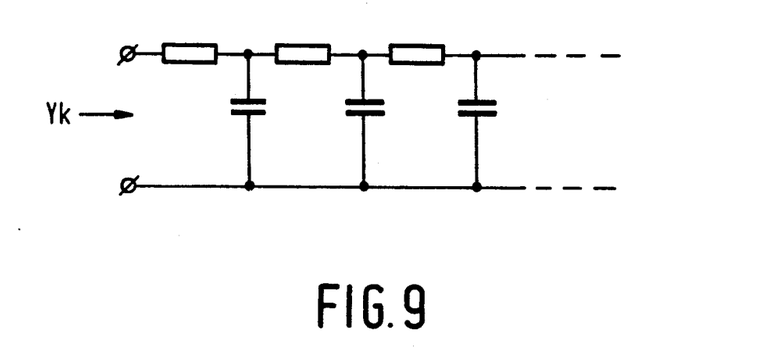
FIG. 9 shows an RC-ladder-type network for use in a balanced filter circuit according to the invention.

An RC line can be approximately represented as an RC ladder, as shown in FIG. 9. Conversely, the admittance of an RC ladder can be approximated and implemented by means of an RC line. Therefore, it is possible to implement the pairs of admittances Y1, Y2, Y3 and Y4 fully or in part as RC lines, which may be advantageous especially with high frequencies. Other equivalent networks, such as non-uniformly distributed RC networks, as the case may be in combination with resistors and/or capacitors, are also possible.

The invention is not limited to the filter circuits of the embodiments described with the associated Figures. For any linear transfer function of any order, it is possible in a manner analogous to that described in the embodiments to determine the admittances Y1, Y2, Y3 and Y4 of the general filter circuit of FIG. 2d.

I claim:

1. A balanced filter circuit having an Nth order transfer function $H_N$ from a balanced input signal to a balanced output signal, N being an integer larger than or equal to two, comprising:
    a first and a second filter input for supplying the balanced input signal;
    a first and a second filter output for deriving the balanced output signal;
    only one balanced amplifier having an inverting input and a non-inverting input and an inverting output coupled to the first filter output and a non-inverting output coupled to the second filter output;
    at least three of a first, second, third and fourth pair of admittances, each pair comprising a first and a second admittance,
the first admittance of the first pair of admittances being connected between the first filter input and the inverting input and the second admittance being connected between the second filter input and the non-inverting input, the first admittance of the second pair of admittances being connected between the first filter input and the non-inverting input and the second admittance being connected between the second filter input and the inverting input, the first admittance of the third pair of admittances being connected between the inverting output and the non-inverting input and the second admittance being connected between the non-inverting output and the inverting input and the first admittance of the fourth pair of admittances being connected between the inverting output and the inverting input and the second admittance being connected between the non-inverting output and the non-inverting input.

2. A balanced filter circuit as claimed in claim 1, characterized in that the filter circuit has a second order transfer function having the shape:

$$H2 = \frac{M*P*Wo/Qo}{P*P + P*Wo/Qo + Wo*Wo}$$

in which
P = complex frequency,
Wo = resonance frequency,
Qo = Q factor and Qo > ½,
M = amplification factor,
and
    the first and the second admittance of the second pair of admittances each comprise a series-combination of a first resistor having a value substantially equal to K*Qo/Wo/M and a first capacitor having a value substantially equal to M*Wo/(Qo*a*K);
    the first and the second admittance of the third pair of admittances each comprise a parallel-combination of a second resistor having a value substantially equal to K*a/(Wo*Wo) and a capacitor having a value substantially equal to 1/K;
    the first and the second admittance of the fourth pair of admittances each comprise a series-combination of a third resistor having a value substantially equal to −K/(−a+Wo/Qo−Wo*Wo) and a third capacitor having a value substantially equal to −(−a+Wo/Qo−Wo*Wo)/(a*K),
a and K being positive real numbers.

3. A balanced filter circuit as claimed in claim 1, characterized in that the filter circuit has a second order transfer function having the shape:

$$H2 = \frac{M * P * Wo/Qo}{P*P + P * Wo/Qo + Wo * Wo}$$

in which
P = complex frequency,
Wo = resonance frequency,
Qo = Q factor and Qo > ½,
M = amplification factor,
and
the first and the second admittance of the second pair of admittances each comprise the series-combination of a first resistor having a value substantially equal to Qo*R/M and a first capacitor having a value substantially equal to M*C/Qo;
the first and the second admittance of the third pair of admittances each comprise the parallel-combination of a second resistor having a value substantially equal to R, a second capacitor having a value substantially equal to C and a series-combination of a third resistor having a value substantially equal to Qo*R and a third capacitor having a value substantially equal to C/Qo;
the first and the second admittance of the fourth pair of admittances each comprise a series-combination of a fourth resistor having a value substantially equal to R/2 and a fourth capacitor having a value substantially equal to 2*C;
R and C being constants to be chosen, for which it holds that:

R*C = 1/Wo.

4. A balanced filter circuit as claimed in claim 1, characterized in that the filter circuit has a second order transfer function having the shape:

$$H2 = \frac{M * (P - a)(P - b)}{(P + a)(P + b)}$$

in which
P = complex frequency,
a, b, = positive real number and a > b,
M = amplification factor,
and
the first and the second admittance of the first pair of admittances each comprise a parallel-combination of a first resistor having a value substantially equal to K/M and a series-combination of a second resistor having a value substantially equal to K/M*(a−b)/(2*(a+b)) and a first capacitor having a value substantially equal to 2*M(a+b)/(-K*a*(a−b));
the first and the second admittance of the second pair of admittances each comprise a series-combination of a third resistor having a value substantially equal to that of a second resistor and a second capacitor having a value substantially equal to that of the first capacitor;
the first and the second admittance of the third pair of admittances each comprise a fourth resistor having a value substantially equal to that of the first resistor, K being a positive real number.

5. A balanced filter circuit as claimed in claim 1, characterized in that the filter circuit has a second order transfer function having the shape:

$$H2 = \frac{P*P - P * Wo/Qo + Wo * Wo}{P*P + P * Wo/Qo + Wo * Wo} * M$$

in which
P = complex frequency,
Wo = resonance frequency,
Qo = Q factor and Qo ≥ ½,
M = amplification factor,
and
the first and the second admittance of the first pair of admittances each comprise a parallel-combination of a first resistor having a value substantially equal to R/M and a first capacitor having a value substantially equal to M*C;
the first and the second admittance of the second pair of admittances each comprise a parallel-combination of a series-combination of a second resistor having a value substantially equal to R/(2*M) and a second capacitor having a value substantially equal to 2*M*C and a series-combination of a third resistor having a value substantially equal to Qo*R/M and a third capacitor having a value substantially equal to M*C/Qo;
the first and the second admittance of the third pair of admittances each comprise a parallel-combination of a fourth resistor having a value substantially equal to R, a fourth capacitor having a value substantially equal to C and a series-combination of a fifth resistor having a value substantially equal to R/2 and a fifth capacitor having a value substantially equal to 2*C;
the first and the second admittance of the fourth pair of admittances each comprise a series-combination of a sixth resistor having a value substantially equal to Qo*R and a sixth capacitor having a value substantially equal to C/Qo,
R and C being constants to be chosen, for which it holds that:

R*C = 1/Wo.

6. A balanced filter circuit as claimed in claim 1, characterized in that the filter circuit has a third order transfer function having the shape:

$$H3 = \frac{(P*P - a * P + b)(P - c)}{(P*P + a * P + b)(P + c)} * M$$

in which
P = complex frequency,
a, b, c = a real positive number larger than zero and a*a < 4*b
M = amplification factor
and
the first and the second admittance of the first pair of admittances each comprise a parallel-combination of a first capacitor having a value substantially equal to M/K and the series-combination of a first resistor having a value substantially equal to K/A/M and a second capacitor having a value substantially equal to M*A/(c*K)
the first and the second admittance of the second pair of admittances each comprise a parallel-combination of a second resistor having a value substantially equal to K/M*b/d and a series-combination of a third resistor having a value substantially equal to −K/B/M and a third capacitor having a value substantially equal to −B*M/(d*K);

the first and the second admittance of the third pair of admittances each comprise a parallel-combination of a fourth resistor having a value substantially equal to K*b/d and a capacitor having a value substantially equal to 1/K;

the first and the second admittance of the fourth pair of admittances each comprise a series-combination of a fifth resistor having a value substantially equal to −K/C and a fifth capacitor having a value substantially equal to −C/(d*K), d being a positive real number larger than c, $A = 2*(c*c + a*c + b)/(d-c)$, $B = -(d + a + b/d)(d+c)/(d-c)$, $C = -(d - a + b/d)$, and K being a positive real number.

7. A balanced filter circuit as claimed in claim 1, characterized in that at least one of the said admittances is composed of an equivalent RC network having substantially the same admittance.

* * * * *